(12) United States Patent
Redeker et al.

(10) Patent No.: US 10,917,984 B2
(45) Date of Patent: Feb. 9, 2021

(54) FOLDABLE DISPLAY APPARATUS FOR A MOTOR VEHICLE

(71) Applicant: AUDI AG, Ingolstadt (DE)

(72) Inventors: Immo Redeker, Ingolstadt (DE); Jacques Hélot, Ingolstadt (DE); Joris Mertens, Ingolstadt (DE)

(73) Assignee: AUDI AG, Ingolstadt (DE)

( * ) Notice: Subject to any disclaimer, the term of this patent is extended or adjusted under 35 U.S.C. 154(b) by 0 days.

(21) Appl. No.: 16/467,839

(22) PCT Filed: Nov. 23, 2017

(86) PCT No.: PCT/EP2017/080225
§ 371 (c)(1),
(2) Date: Jun. 7, 2019

(87) PCT Pub. No.: WO2018/104067
PCT Pub. Date: Jun. 14, 2018

(65) Prior Publication Data
US 2020/0137905 A1 Apr. 30, 2020

(30) Foreign Application Priority Data
Dec. 8, 2016 (DE) .......... 10 2016 224 500

(51) Int. Cl.
*G06F 1/16* (2006.01)
*H05K 5/02* (2006.01)
(Continued)

(52) U.S. Cl.
CPC ............ *H05K 5/0217* (2013.01); *B60R 11/00* (2013.01); *B60R 11/0235* (2013.01);
(Continued)

(58) Field of Classification Search
CPC .................................................. H05K 5/0217
See application file for complete search history.

(56) References Cited

U.S. PATENT DOCUMENTS 5,847,685 A 12/1998 Otsuki
2009/0161302 A1* 6/2009 Ferren .................... B60K 35/00
361/679.01
(Continued)

FOREIGN PATENT DOCUMENTS

DE 60031818 T2 3/2007
DE 102012010679 A1 12/2013
(Continued)

OTHER PUBLICATIONS

International Search Report for PCT/EP2017/080225 dated Feb. 13, 2018.
(Continued)

*Primary Examiner* — Jerry Wu
(74) *Attorney, Agent, or Firm* — Staas & Halsey LLP

(57) ABSTRACT

A display device has a display surface with at least two display regions for displaying display content, and a folding device configured to fold the display surface. The folding device can optionally have a rail element which runs parallel to a direction of extent of one of the display regions and is arranged displaceably parallel thereto. A lever element of the folding device has a first end arranged on the rail element, and a second end with at least one holding element arranged on a foldable display region.

20 Claims, 7 Drawing Sheets

(51) Int. Cl.
  *B60R 11/00*   (2006.01)
  *B60R 11/02*   (2006.01)
  *H05K 5/00*   (2006.01)

(52) U.S. Cl.
  CPC .... *H05K 5/0017* (2013.01); *B60R 2011/0007* (2013.01); *B60R 2011/0085* (2013.01); *B60R 2011/0092* (2013.01)

(56) References Cited

U.S. PATENT DOCUMENTS

2012/0268665 A1   10/2012  Yetukuri et al.
2012/0307472 A1*  12/2012  Bohn ................ G06F 1/1652
                                                                               361/807
2013/0222276 A1    8/2013  Kim et al.

FOREIGN PATENT DOCUMENTS

| DE | 102014016323 A1 | 5/2016 |
|---|---|---|
| DE | 102016224500.7 | 12/2016 |
| WO | 98/09842 | 3/1998 |
| WO | 2015/140785 A1 | 9/2015 |
| WO | PCT/EP2017/080225 | 11/2017 |

OTHER PUBLICATIONS

German Office Action for German Application No. 102016224500.7 dated Oct. 9, 2017.
English Translation by WIPO dated Jun. 13, 2019 of the International Preliminary Report on Patentability in corresponding International Patent Application No. PCT/EP2017/080225.

* cited by examiner

FOLDABLE DISPLAY APPARATUS FOR A MOTOR VEHICLE

CROSS REFERENCE TO RELATED APPLICATIONS

This application is the U.S. national stage of International Application No. PCT/EP2017/080225, filed Nov. 23, 2017, and claims the benefit thereof. The International Application claims the benefit of German Application No. 10 2016 224 500.7 filed on Dec. 8, 2016, both applications are incorporated by reference herein in their entirety.

BACKGROUND

Described below is a display apparatus for a motor vehicle, having a display surface device, wherein the display surface device has a display surface for displaying a display content. A display apparatus here is an appliance or an appliance component which is designed for displaying image content, for example a screen. The display surface device here is that component which forms or includes the display surface.

Modern motor vehicles generally have a user interface which can serve, for example, to communicate with the motor vehicle. One such user interface has a screen in order, for example, to provide menu functions for selection. Other screens, such as, for example, that of an instrument cluster, serve for displaying important information during operation of the motor vehicle. Instrument clusters and infotainment systems which require a relatively large amount of construction space are customary here. The motor vehicle can be retrofitted for an additional display content, by, for example, a separate screen, for example an additional "After-Market Display" for displaying additional content being able to be attached, for example, to a windscreen of the motor vehicle. The provision of screen content is therefore currently dependent on a fixed, limited display size.

In particular when additional screens are used, visual confusion arises, as does the disadvantage for the motor vehicle manufacturer of not being able to be distinguished from competitors. The visual confusion results in a lack of clarity which makes rapid locating of a certain display content difficult.

US2012/0268665 A1 discloses a screen which can be arranged on a rear side of a headrest of the driver's seat or front passenger's seat. This serves for providing information to a passenger on a rear bench. In order to save construction space, the screen can be designed as a projection screen which can be rolled up in a well of the motor vehicle seat. Alternatively, the screen can be rolled up in the headrest or stowed in a headliner similarly to a projection screen for a slide projection. Such a screen requires little construction space when the screen is not in use, but only the full size of the screen service can be requested at the commissioning stage.

A stretchable screen of a mobile electronic appliance is known from WO 2015/140785 A1, wherein the screen is made of an elastic material and can be bent. The screen can be used in a stretched state. However, the elasticity gives rise here to the same problem as in the screen from the related art mentioned further above, since an elastic material in a stretched state is under tension and therefore can only be completely extended or completely stowed. Apart therefrom, WO 2015/140785 A1 does not provide any possibility of use in a motor vehicle, since the use of an elastic screen in a motor vehicle causes the additional problem that, during use, the screen has to be firmly held and, under some circumstances, snaps back into a stowage space if the driver, for example by mistake, releases the locking mechanism. The use of such an elastic screen is therefore highly problematic for a user of a motor vehicle and does not take into consideration the fact that, for example, a driver should primarily be paying attention to driving activities.

US2013/0222276 A1 likewise describes a flexible display which can be bent, i.e. it can be changed in its shape counter to an elastic resistance. The disadvantages mentioned above also arise here.

SUMMARY

Described below is a space-saving display apparatus which reduces the disadvantages mentioned above.

The concept of enlarging or reducing a display surface by opening up or folding the display surface. The display surface then does not unnecessarily dominate an interior of the motor vehicle and takes up less construction space. In addition, the disadvantages mentioned above regarding the handling of the display apparatus are reduced.

The display apparatus for a motor vehicle can be designed, for example, as a screen and having a display surface device with a display surface for displaying a display content. The display surface device has at least two display regions. The display apparatus described herein has a folding device which is configured to fold or to swing the display surface device—and therefore the display surface. In contrast to "bending" or "stretching", folding or swinging takes place without tension, and therefore the display surface device is not deformed counter to an elastic resistance. The word "foldable" can therefore also be understood as meaning "movable" or "swingable". In this description, a folding device is understood as meaning an appliance component or a component which is designed to fold or to swing the display surface device, that is to say to move two display regions of the display surface device or of the display surface towards each other without this taking place counter to an elastic resistance. The folding device may therefore also be referred to as a "swinging device". A display surface device can have, for example, a screen, the shape of which can be changed in such a manner that the deformation takes place without elastic resistance.

The display apparatus described herein reduces or even eliminates the abovementioned disadvantages, and the advantages already mentioned are produced. Owing to the fact that the display surface device is folded, but is not bent or stretched, the additional advantage is produced that a folding angle or swinging angle between two display regions can be freely selectable. The display apparatus requires little construction space, but provides additional space for displaying additional information. A further advantage is that the display surface can be enlarged or reduced depending on current requirements.

The folding device can be designed, for example, as a joint or hinge between the two display regions of the display surface device. This is a particularly simple and cost-effective variant of the display apparatus.

The folding device can have a rail element which runs parallel to a direction of extent of one of the display regions of the display surface device and is mounted displaceably parallel thereto. A rail element is considered here to be a component having a rail function and, for example, is designed as a rail and is mounted displaceably on a further, stationary rail with latching elements. Via, for example, a pinion on the rail element, such an exemplary rail element can be displaced parallel to the direction of extent of one of the two display regions or, if the display surface is completely folded up, can be displaced parallel to the two display regions.

The folding device can have, for example, a lever element which can be designed as a bow and which has a first end and a second end, wherein the first end is mounted pivotably on the rail element. The lever element, i.e. a component which, in a mounted state, can carry out a lever function, can be arranged at its second end on at least one holding element, wherein the holding element is likewise part of the folding device and can be arranged fixedly on a foldable display region of the display surface device. The at least one holding element may be mounted movably at the second end of the lever element.

Such a construction constitutes a particularly efficient possibility of providing a predetermined portion of the display surface without any steps. Such a mechanical construction can be driven, for example, by an electronically controlled electric motor.

According to one development, the at least one holding element can be arranged on a side of the foldable display region that faces the rail element and/or at a free end and/or on an edge of the foldable display region. These are various embodiments which permit simple folding of the display surface.

According to a further development, it can be provided that a first end of the rail element and the foldable display region, on which the holding element is arranged, are arranged on the same side of the display surface device. This is a particularly efficient construction of the folding device.

The folding device can additionally or alternatively have a clip element, i.e. a component with a clip action, which can surround a partial region of one end of the display surface device. This serves for the additional holding of the display surface device and forms a particularly construction-space-saving construction of the display surface device.

For the display apparatus, it can be provided, according to a further embodiment, that the display apparatus has a control device, i.e. a component or an appliance component for electronically controlling the display apparatus, wherein the control device can be configured in order, depending on an operating signal describing an operating action, to adjust a folding angle or swinging angle, described by the operating signal, between the two display regions of the display surface device. This allows a portion of the display surface available to the user to be adjusted in a user-specific manner by folding.

The motor vehicle can be, for example, a passenger car. The motor vehicle includes an embodiment of the display apparatus with a display surface device which can be arranged in a control panel and/or in a center console of the motor vehicle. The advantages mentioned above are thereby achieved.

Also described below is a method for operating an embodiment of the display apparatus according, including receiving an operating signal by the control device of the display apparatus, wherein the operating signal describes an operating action of a user of the display apparatus, depending on the received operating signal, generating a control signal for controlling the folding device depending on the operating signal, and adjusting a swinging angle between the two display regions by the folding device depending on the control signal. The advantages mentioned above are also produced here.

A method may have features as described herein in conjunction with the developments of the motor vehicle.

BRIEF DESCRIPTION OF THE DRAWINGS

These and other aspects and advantages will become more apparent and more readily appreciated from the following description of exemplary embodiments, taken in conjunction with the accompanying drawings of which:

FIG. 6b is a cross section of an embodiment of the display apparatus illustrated in FIG. 6a.

DETAILED DESCRIPTION OF THE PREFERRED EMBODIMENT

In the exemplary embodiment described below, components of the embodiment each constitute individual features which should be considered independently of one another and should be considered part individually or in a different combination than that shown. Furthermore, the described embodiment can also be supplemented by the already described features.

In the figures, functionally identical elements are each provided with the same reference sign.

Figure 1A:
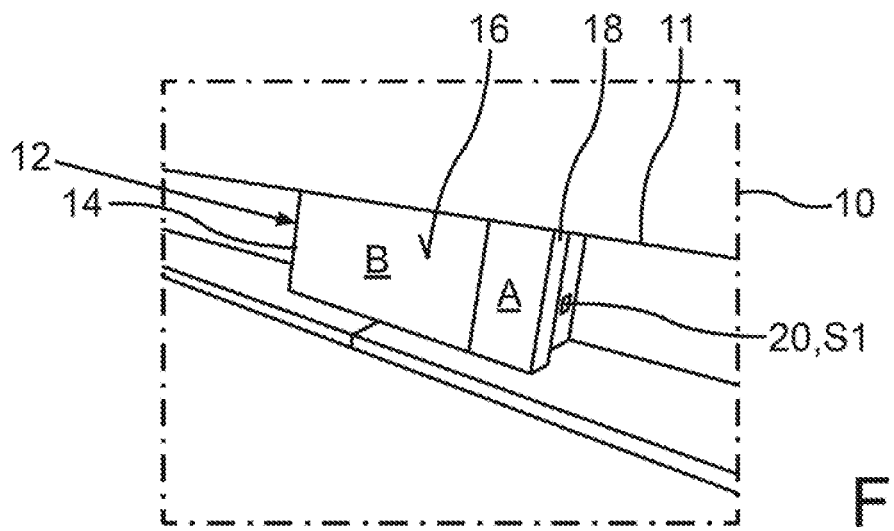
FIGS. 1a, 1b, and 1c are perspective views of an embodiment of a display apparatus.

FIGS. 1a, 1 b and 1c illustrate the principle of a display apparatus and of a method for operating such a display apparatus, with reference to a first exemplary embodiment.

For this purpose, FIGS. 1a, 1 b and 1c illustrate a motor vehicle 10 which can be, for example, a passenger car. The motor vehicle 10 has, for example, an interior equipment element 11, for example a center console or a counter, in or on which the display apparatus 12 can be arranged. The display apparatus 12 can be arranged here, for example, in a rail-like indentation in the interior equipment element 11. The display apparatus 12 can be designed, for example, as an appliance having a screen and, for this purpose, can provide, for example, a corresponding component with a display surface 16. Such a display surface device 14 can be designed, for example, as a touch-sensitive screen. Exemplary display surface devices 14 are known to a person skilled in the art from the related art, for example from DE 10 2014 016 323 A1. This describes a colored screen having organic light-emitting diodes ("OLED display") with a flexible configuration made from pliable glass or pliable Plexiglas.

Figure 1B:
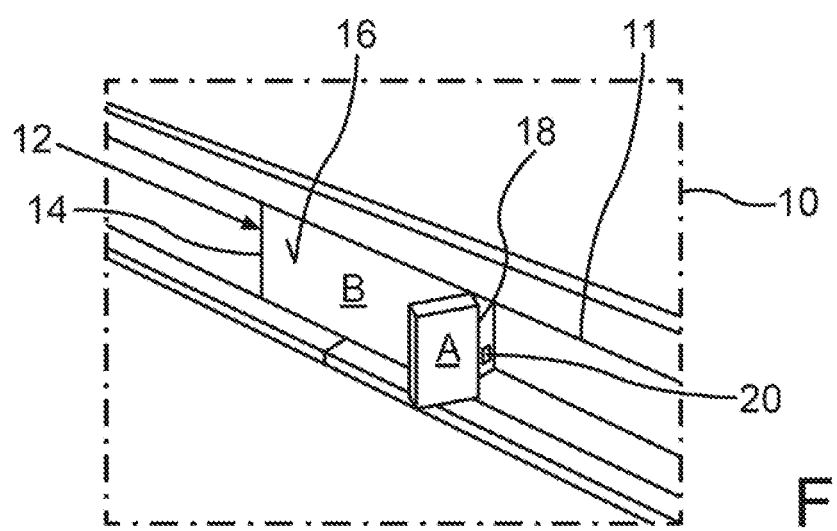
Figure 1C:
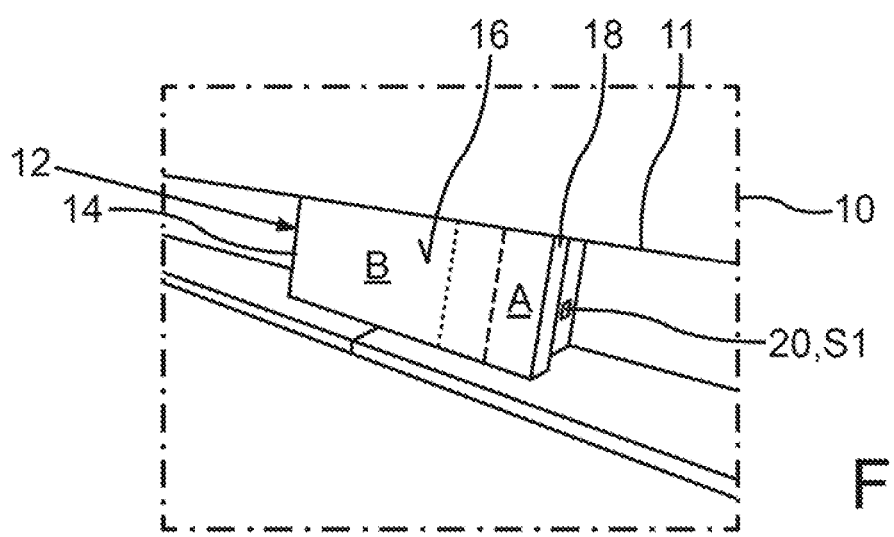

The display surface device 14 provides the display surface 16 on which display elements, i.e., for example, a text or images, can be displayed. The display surface device 14 here has at least two display regions A, B. Consequently, the display surface 16 also has at least two display regions A, B. FIG. 1a showed a folded display region A and a further display region B. FIG. 1c showed the display regions A and B, wherein the display surface device 14 is unfolded or opened up. The dotted line illustrates the boundary between the two display regions A, B, while the dashed line of FIG. 1c marks the regions at which the display region A has been folded or swung. In the example of FIGS. 1a, 1B, and 1c, the surfaces of the two display regions B and A can be at a ratio of, for example, 2:1 to each other.

The display device 12 likewise has a folding device 18, which may also be referred to as a swinging device. In the example of FIGS. 1a, 1b and 1c, the folding device 18 can be designed, for example, as a joint between the two display regions A, B, or as a hinge.

The folding device 18 can optionally be adjusted, and therefore controlled, mechanically and/or electronically. For this purpose, the display apparatus 12 of FIGS. 1a, 1b, and 1c shows a control device 20 which can be designed, for example, as a control board and can have, for example, a microprocessor and/or a microcontroller. The control device 20 can be connected, for example by a wired communication connection, for example a wire or a databus, to the folding device 18 and/or to an electric motor for controlling the folding device 18. An optional electric motor is not shown in the examples of FIGS. 1a, 1b, 1c.

In the example of FIGS. 1a, 1b and 1c, the motor vehicle 10 can have, for example, what is referred to as a multimedia interface, i.e. a user interface, via which, for example, a menu having different motor vehicle functions can be displayed to a user and via which the user can control the functions, for example by an operating action.

For example, during travel at night, a screen of the multimedia interface outputs light into an interior of the motor vehicle 10. The motor vehicle 10 can, for example, additionally have an instrument cluster which can likewise have a screen. When required, if the user wishes, for example, to be shown a menu for functions of the comfort system or to start a navigation system, the display surface device 14 of the display apparatus 12, which can be structurally separated from the multimedia interface or the instrument cluster, can be activated and, for example, can unfold or open up the display region A, which is folded in an inoperative state.

If, for example, the display apparatus 12 is no longer being used, the display region A, for example, can be swung in again such that a smaller overall area of the display surface 16 can be seen and therefore also less light is output into the interior of the motor vehicle 10. As a result, in an inoperative state, the illumination in the display apparatus 12 into the interior is then more restful, which can have a calming effect on the driver and therefore the driver is less distracted. The mechanism of the display apparatus 12 additionally ensures an astonishing effect which increases the fun for the user in operating the display apparatus 12.

Alternatively to the example mentioned, according to which the folding device 18 can be controlled electrically and/or electronically, a purely mechanical swinging mechanism can also be provided by a corresponding design of the folding device 18, in which, for example, upon mechanical pressing on a swung-in display region A, mechanical unfolding can take place such that the entire display surface 16 can be seen. For this purpose, the folding device 18 can have, for example, a known spring mechanism and a locking mechanism.

Should the user, for example, wish to use an air-conditioning function of an air-conditioning system of the motor vehicle, the user may, for example, wish to enlarge the display surface 16 in order, for example, to allow corresponding display elements for operating the air-conditioning system to be depicted on the unfolded display region A. By, for example, mechanical pressing or, for example, an operating action, which may be, for example, touching of a touch-sensitive display surface 16 or of a corresponding operating element, for example of a multimedia interface, the folding device 18 can be actuated mechanically and/or electronically.

In the event of an electronic control for this purpose, the control device 20, in S1, can receive an operating signal which can describe the operating action. Depending on the beginning received signal, the control device, in S2, can generate a control signal which can be transmitted, for example, to an electric motor (not shown in FIGS. 1a, 1b, 1c), and the exemplary electric motor can control the folding device 18 in such a manner that, for example, a swinging angle or folding angle of 180° can be set between the two display regions A, B (S3).

For this purpose, FIG. 1b shows the swinging-open operation represented by an arrow. FIG. 1c, as already mentioned above, shows the swung-open display surface device 14 or the unfolded display surface device 14 with a swinging angle or folding angle of, for example, 180°. Alternatively, for example, the control device 20 can be programmed in such a manner that a swinging angle of, for example, 45° or 35° can be set, wherein such a swinging angle can have the effect, for example, that the swung-open display region A of the display surface device 14 can lie, for example, at a particularly favorable viewing angle for the user.

Additionally or alternatively, it can be provided that the setting of the swinging angle (S3) depends, for example, on how long the user carries out the operating action or whether the user touches the swinging-open display region A in order to set the swinging angle.

Figure 2A:
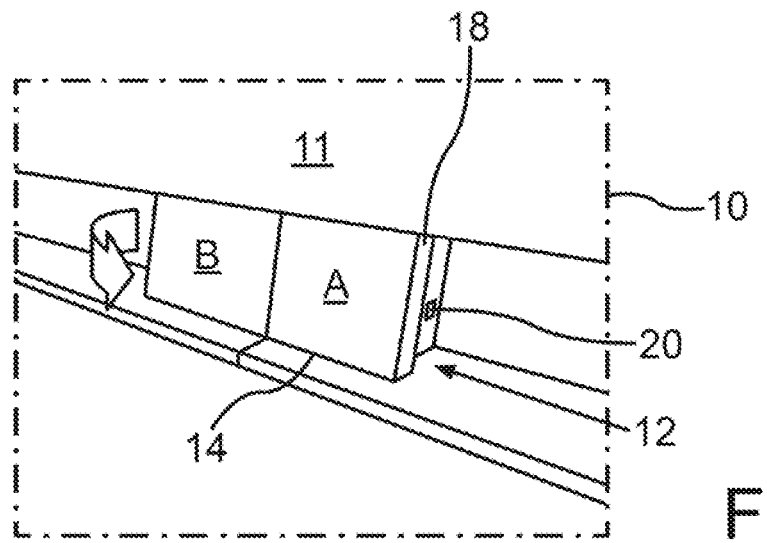
FIGS. 2a, 2b, and 2c are perspective views of an embodiment of a display apparatus.
Figure 2B:
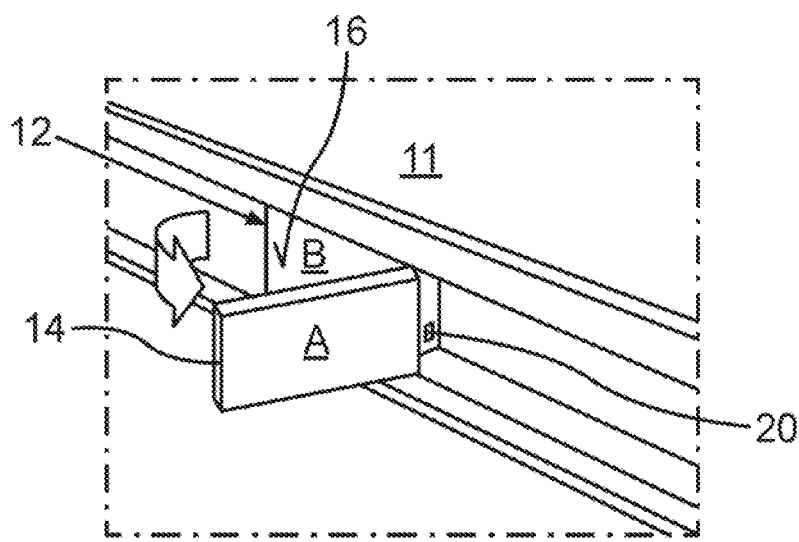
Figure 2C:
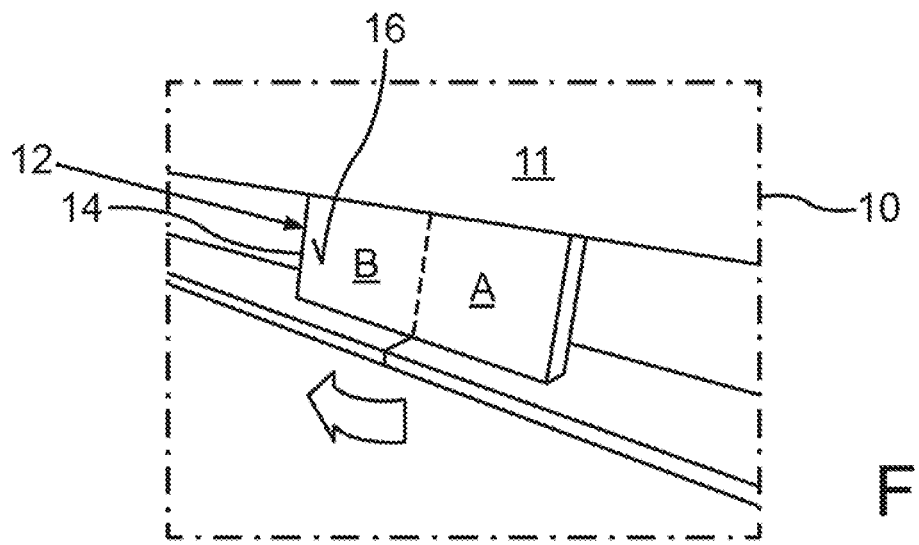

FIGS. 2a, 2b and 2c illustrate a further exemplary embodiment which can very substantially correspond to that of FIGS. 1a, 1b and 1c, wherein only the differences will be described below.

In the example of FIGS. 2a, 2b, 2c, a ratio of the surfaces of the display regions B to A can be, for example, 1:1. The arrow in FIG. 2b illustrates the swinging open or unfolding of the display region A, while the arrow in FIG. 2c indicates the direction in which the display region A can be swung in or folded in again.

Figure 3:
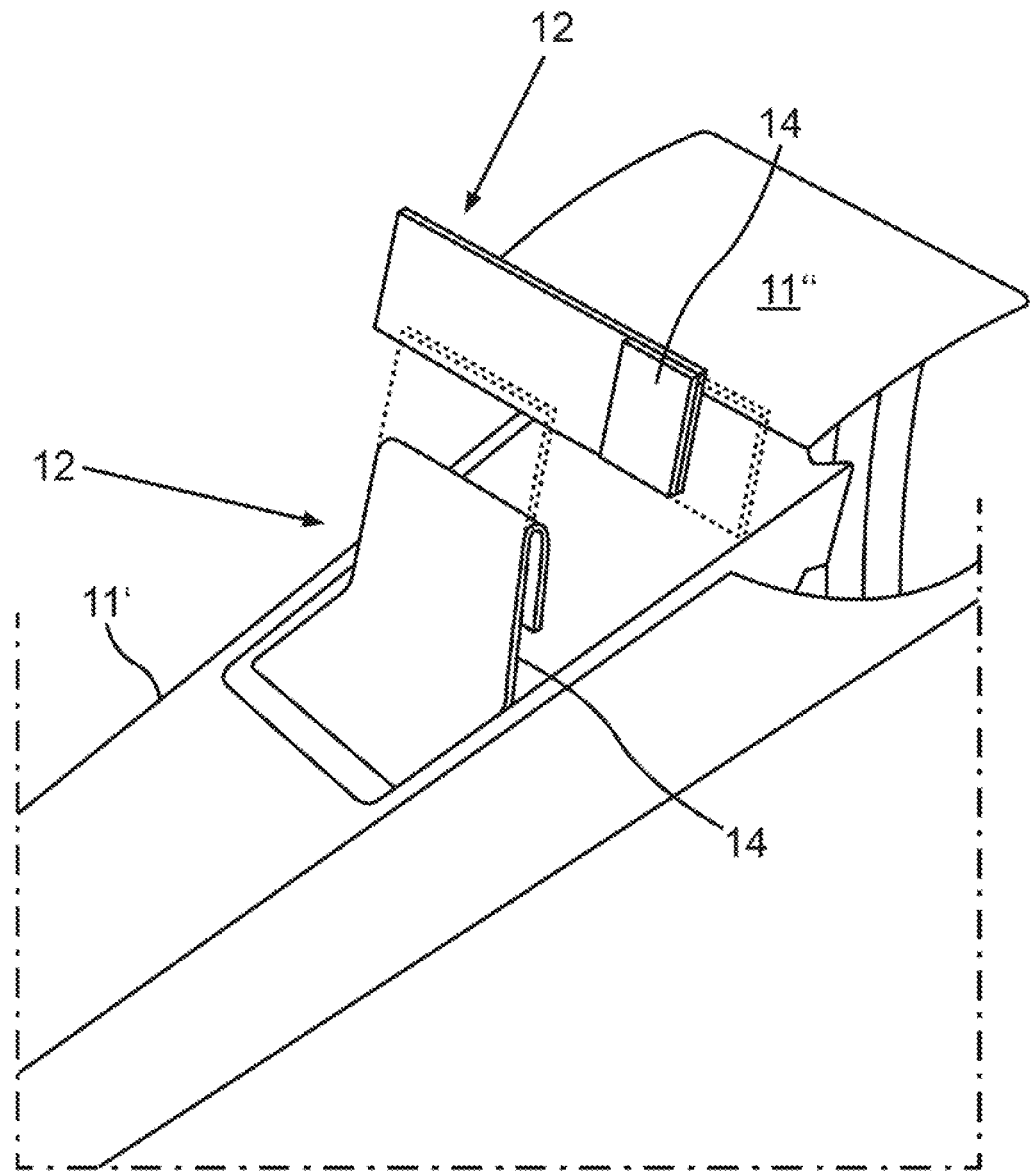
FIG. 3 is a perspective view of an embodiment of a display apparatus.

FIG. 3 illustrates further exemplary embodiments of a display apparatus 12, wherein, for example, one display apparatus 12 can be arranged in a center console 11' and a further display apparatus 12 can be arranged, for example, in an instrument panel or control panel 11". The respective display apparatus 12 can be designed, for example, as described in one of the exemplary embodiments described above. The regions bordered by a dotted line show the respective display region A, B in an unfolded or swung-open extent. The arrows show by way of example a swinging or folding direction for one of the display regions A, B.

Figure 4A:
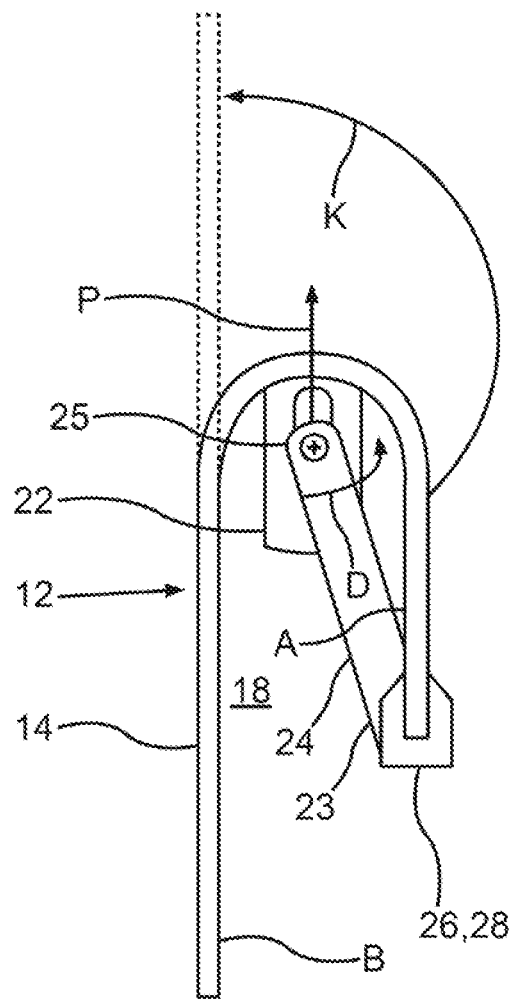
FIGS. 4a, and 4b are side views of an embodiment of a display apparatus.
Figure 4B:
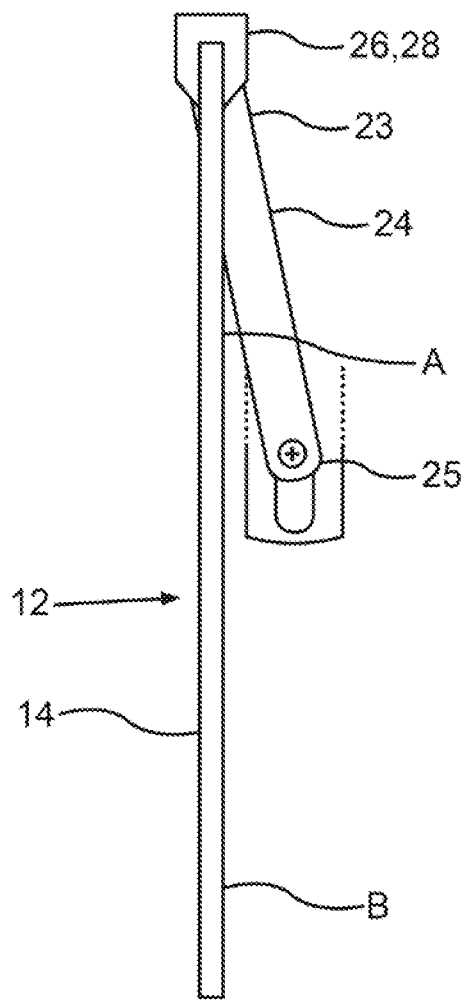

FIGS. 4a and 4b show an exemplary folding or swinging mechanism for the example of the display apparatus 12 in the exemplary center console 11' from FIG. 3. For this purpose, FIG. 4a shows the display apparatus 12 with a folded display region A, as in FIG. 3. The folding device 18 for this purpose can have, for example, a rail element 22, a lever element 24 and a holding element 26. The rail element 22 can be designed, for example, as a plate with an elongate through-bore or an elongate hole, along which a first end 25 of the lever element 24 can be mounted displaceably in the direction P and in the opposite direction thereof. The lever element 24, designed for example as a rod or lifter, at a first end 25 can have, for example, a holder which can be fitted into the through-bore of the rail element 22 and can be mounted movably therein.

A holding element 26 which can be, for example, part of the lever element 24, or a separate component, can be arranged at a second end 23 of the lever element 24. In the example of FIG. 4a and FIG. 4b, the holding element 26 can be designed as a clip element or clamping element which can clasp or surround an end of the display surface device 14.

The lever element 24 can be mounted rotatably, for example, on the rail element 22 such that, in addition to the displacement in the direction P and the opposite direction thereof, the lever element can also be rotated about an axis, which is indicated as X in FIG. 4a and in FIG. 4b, in the direction D—and/or in the corresponding opposite direction. The rotation D can then cause the display surface device 14 to be swung open or unfolded in the swinging direction K. FIG. 4b shows the construction of FIG. 4a in a swung-open state.

In the example of FIG. 4a and FIG. 4b, the second end 23 of the lever element 24 can be arranged, for example, fixedly on the holding element 26, or else, for example, via a rotatable bearing.

Figure 5A:
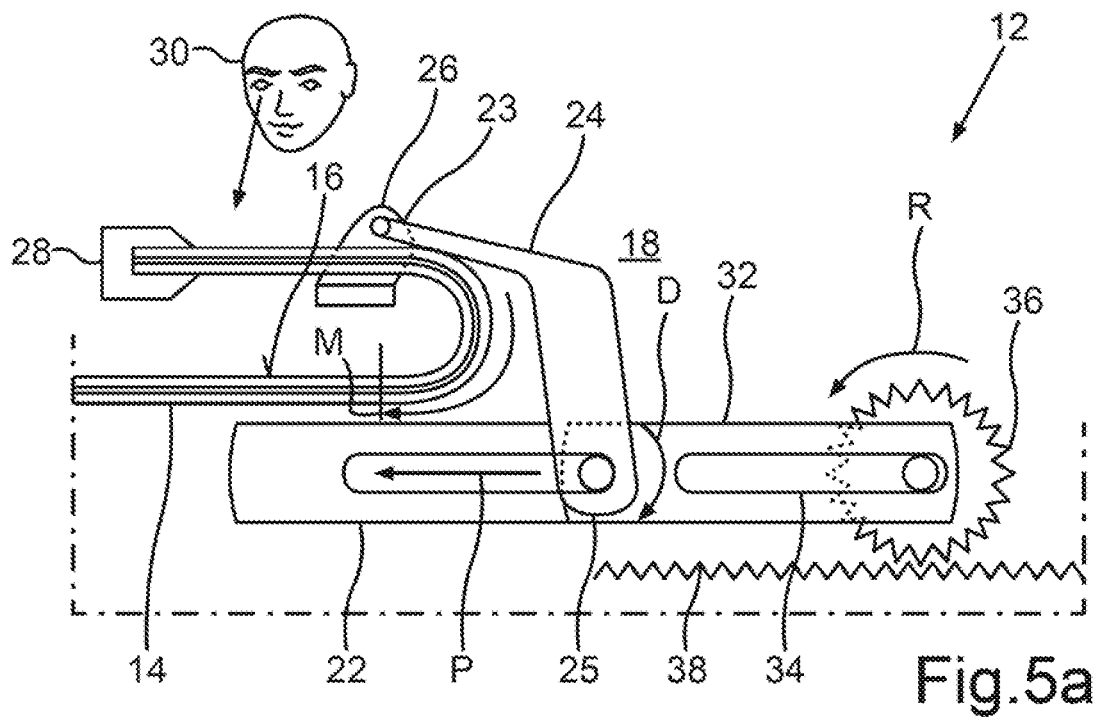
FIGS. 5a, 5b, and 5c are side views of an embodiment of a display apparatus.
Figure 5B:
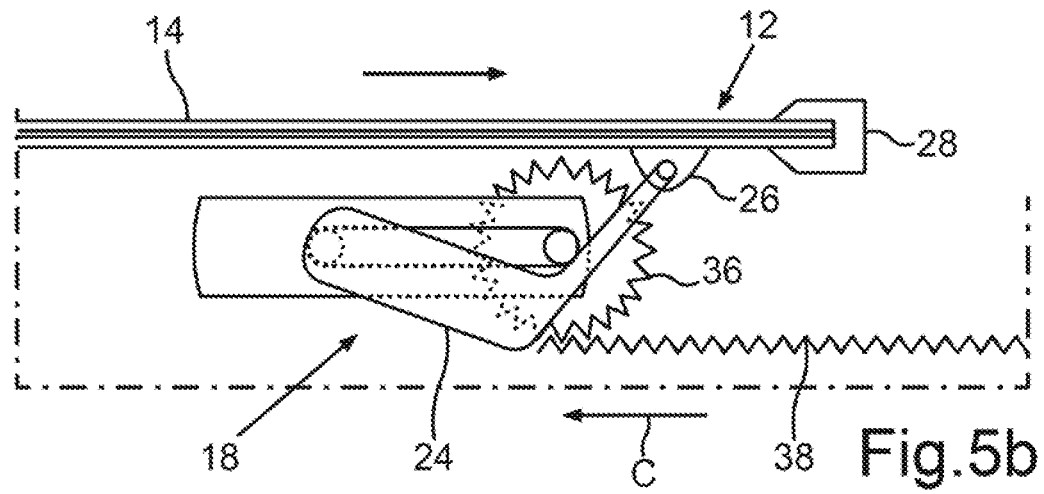
Figure 5C:
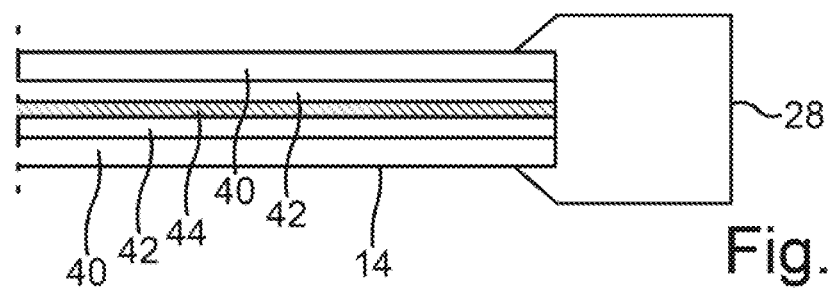

FIGS. 5a, 5b and C show a further exemplary embodiment of the display apparatus 12, wherein only the differences from the previous exemplary embodiments will be discussed below. FIGS. 5a, 5b and 5c emphasize the design of the folding device 18.

FIG. 5a shows the user 30 looking at the display surface 16 which can be designed, for example, as a foldable or swingable OLED display. The arrow Q and the marking M mark by way of example that region of the display surface 16 on which the exemplary OLEDs can be mounted. One end of the display surface device 14 can have a clip element 28 which can surround the display surface device 14.

The lever element 24 can be designed, for example, as a bent arm which, for example, can be arranged movably on a holding element 26. A corresponding rail element 22 has already been previously described. In addition, the rail element can have, for example, a cassette 32 which, like the rail element 22, can be manufactured, for example, from a plastic or a metal. The cassette 32 can have, for example, an elongate through bore or an elongate hole 34 in which, for example, a pinion 36 can be movably mounted. The exemplary pinion 36 can rotate, for example, in the direction R and, in the process, can move, for example, along a latching strip 38 which can have, for example, latching elements. Such latching elements can be designed, for example, as teeth or cams which can enter into engagement with the corresponding depressions of the exemplary pinion 36. By the rotational movement R, the movement can then take place in the direction P, as a result of which rotation D of the lever element 24 can be brought about.

FIG. 5b shows the display surface device 14 in a tensioned or unfolded state, and the arrangement of the individual elements of the folding device 18. The arrow C showed the direction of movement of the cassette 32, with the lever element 24 rotating at the same time as the cassette 32 moves.

FIG. 5c is a detailed view of one end of the display surface device 14 with the clip element 28 and illustrates an exemplary design of the display surface device 14. The latter can have, for example, one or more flexible cover films 40 which can be arranged on both sides of the display surface device 14 and which can have one or more lighting element layers, wherein a lighting element layer 42 is understood as meaning a surface or layer having lighting elements, such as, for example, OLEDs or LEDs. In the example of FIG. 5c, the display surface device 14 can have, for example, two lighting element layers 42 which can be separated, for example, by a carrier layer 44. Such a carrier layer 44 can be composed of a suitable carrier material for the lighting element layers 42 or can have such a carrier material.

Figure 6A:
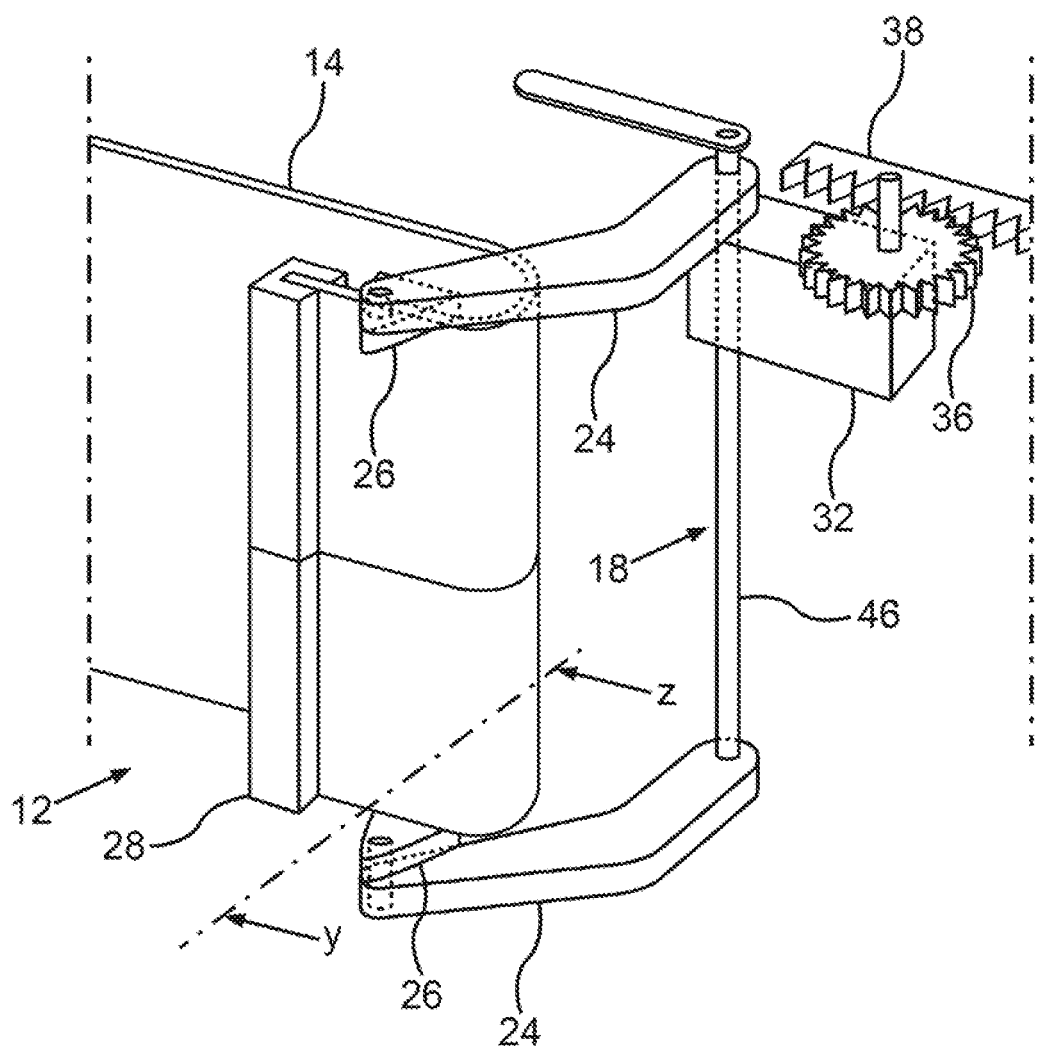
FIGS. 6a and 6c are perspective views of an embodiment of a display apparatus.
Figure 6B:
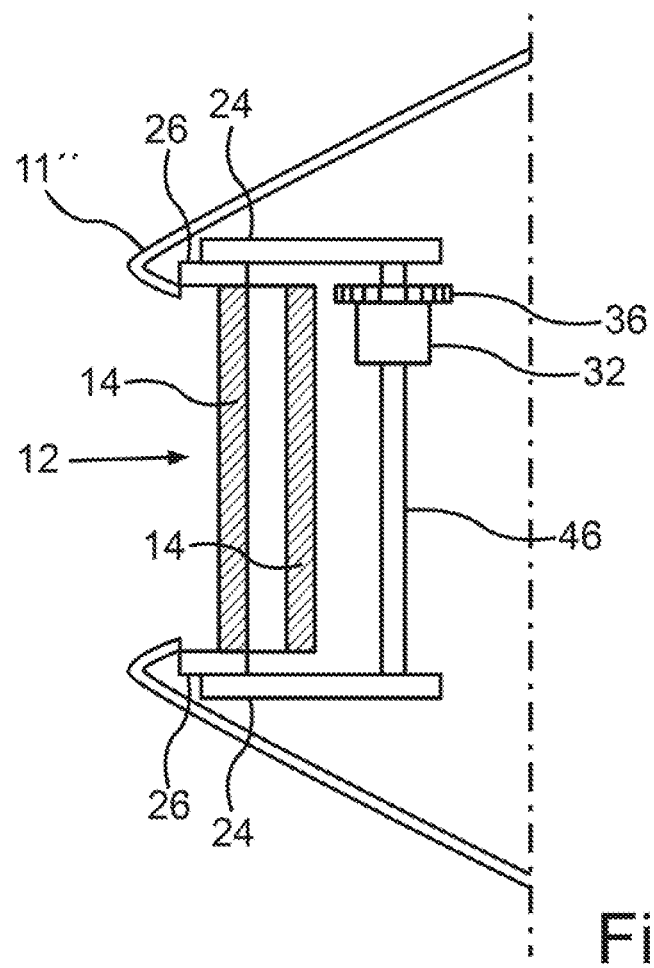
Figure 6C:
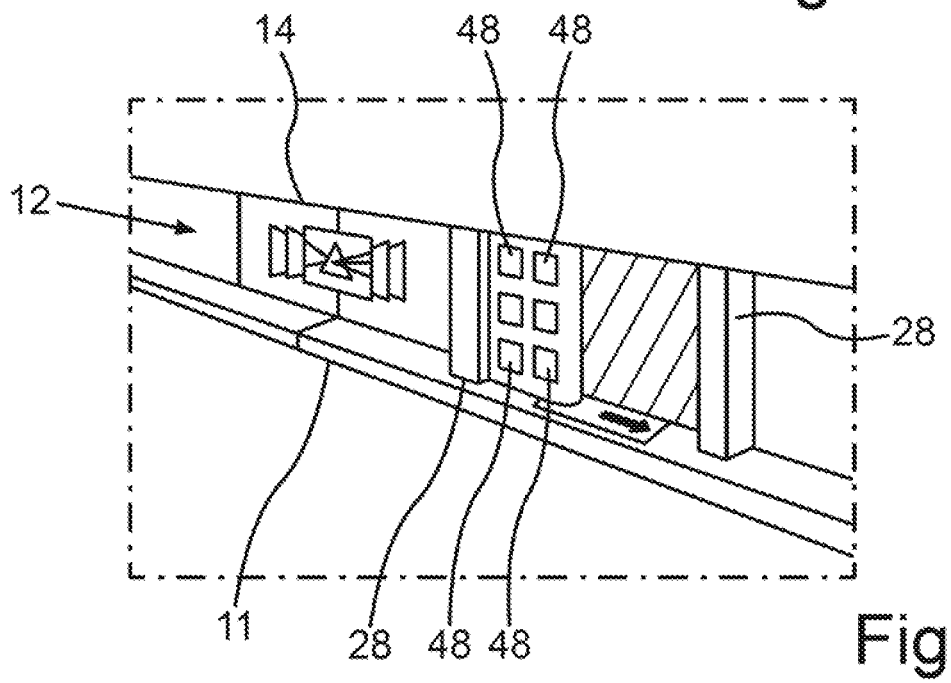

FIGS. 6a, 6b, and 6c illustrate a further exemplary embodiment the display apparatus 12, wherein the clip element 28 can be, for example, a web surrounding the display surface device 14. The folding device 18 can very substantially resemble, for example, the folding device 18 illustrated in FIGS. 5a, 5b and 5c, with the differences being discussed below. In the example of FIG. 6a, the lever element 24 can have, for example, two levers which can each be positioned to the side of the display surface device 14 and can each be connected to a holding element 26, wherein each of the holding elements 26 can be arranged on a lateral edge of the display surface device 14. The two levers of the lever element 24 can be connected to each other here, for example via a stay 46.

FIG. 6b shows a section along the section line Y-Z shown in the Figure of 6a. The display apparatus 12 can be arranged, for example, on a control panel 11", for example can be adhesively bonded or screwed thereon. The display surface device 14 is shown here in a folded state.

FIG. 6b illustrates an exemplary embodiment of a display surface device 14 which is folded or swung in, wherein display elements 48 can be seen on the display surface 16. The display elements 48 can be used, for example, for operating a radio or an air-conditioning system or another function of the motor vehicle. For reasons of clarity, not all of the display elements 48 in FIG. 6c have been provided with reference signs. The shaded surface here shows the extent of the display surface device 14 in an unfolded state.

The exemplary embodiments described above illustrate a display apparatus 12 in which a display surface device 14 can be enlarged simply by opening up or swinging open or unfolding.

Such a display apparatus 12 can be referred to, for example, as a "folding display" and makes it possible to present a plurality of variations and different content to a user, for example a driver, at the same time. The construction space permits, for example, a double display size by superimposing the folding surfaces, i.e. the display regions A, B or the display region A, B. The display apparatus 12 can also be important for a passenger in order to be able to display additional contents to the passenger without interfering with settings made by a driver.

Such a display apparatus 12, for example a display, advantageously does not dominate unnecessarily in an interior of the motor vehicle. For example, according to a further exemplary embodiment, a 100% screen plus 100% screen can be provided, in other words a double display surface 16. A swinging angle can be freely selectable here. The display apparatus 12 can be used, for example, as an additional passenger display. A motor vehicle manufacturer can thereby be differentiated from a competitor. In addition, an interior of the motor vehicle 10 is tidied up.

A description has been provided with particular reference to preferred embodiments thereof and examples, but it will be understood that variations and modifications can be effected within the spirit and scope of the claims which may include the phrase "at least one of A, B and C" as an alternative expression that means one or more of A, B and C may be used, contrary to the holding in Superguide v. DIRECTV, 358 F3d 870, 69 USPQ2d 1865 (Fed. Cir. 2004).

The invention claimed is:
1. A display apparatus for a motor vehicle, comprising: a display surface device with a display surface configured to display content, having at least first and second display regions, the first display region always viewable by an occupant of the motor vehicle; and a folding device configured to fold the at least first and second display regions of the display surface device, the folding device including a rail element disposed displaceably parallel to a longitudinal axis of the first display region; a lever element having a first end and a second end, the first end coupled to the rail element; and at least one holding element coupled to the second display region which is foldable, and to the second end of the lever element.

2. The display apparatus according to claim 1, wherein the folding device includes a hinge between the first and second display regions of the display surface device.

3. The display apparatus according to claim 2, wherein the at least one holding element is coupled to at least one of a side of the second display region facing the rail element, a free end of the second display region and an edge of the second display region.

4. The display apparatus according to claim 3, wherein an end of the rail element and the second display region are arranged on a same side of the display surface device.

5. The display apparatus according claim 4, wherein the folding device further includes a clip element surrounding at least part of one end of the display surface device.

6. The display apparatus according to claim 5, further comprising a control device configured to adjust a swinging angle, depending on an operating signal describing an operating action and the swinging angle, between the first and second display regions of the display surface device.

7. The display apparatus according to claim 1, wherein the at least one holding element is coupled to at least one of a side of the second display region facing the rail element, a free end of the second display region and an edge of the second display region.

8. The display apparatus according to claim 1, wherein an end of the rail element and the second display region are arranged on a same side of the display surface device.

9. The display apparatus according claim 1, wherein the folding device further includes a clip element surrounding at least part of one end of the display surface device.

10. The display apparatus according to claim 1, further comprising a control device configured to adjust a swinging angle, depending on an operating signal describing an operating action and the swinging angle, between the first and second display regions of the display surface device.

11. A method for operating a display apparatus, comprising:
receiving an operating signal by a control device of the display apparatus;
generating a control signal, depending on the operating signal, controlling a folding device configured to fold a display surface device of the display apparatus with a display surface having at least first and second display regions, the first display region always viewable by an occupant of the vehicle and the folding device having a rail element disposed displaceably parallel to a longitudinal axis of the first display region,
a lever element having first and second ends, the first end coupled to the rail element, and
at least one holding element coupled to the second display region which is foldable, and to the second end of the lever element; and
adjusting a swinging angle in a plane containing the longitudinal axis and substantially perpendicular to a transverse axis of the first display region, depending on the control signal, between the first and second display regions, by the control device, from the first position to a second position in which the first and second display regions are substantially aligned and abutting.

12. A motor vehicle, comprising a display apparatus as recited in claim 1.

13. The motor vehicle according to claim 12, wherein the folding device includes a hinge between the first and second display regions of the display surface device.

14. The motor vehicle according to claim 12, wherein the at least one holding element is coupled to at least one of a side of the second display region facing the rail element, a free end of the second display region and an edge of the second display region.

15. The motor vehicle according to claim 12, wherein an end of the rail element and the second display region are arranged on a same side of the display surface device.

16. The motor vehicle according to claim 12, wherein the folding device further includes a clip element surrounding at least part of one end of the display surface device.

17. The motor vehicle according to claim 12, further comprising a control device configured to adjust a swinging angle, depending on an operating signal describing an operating action and the swinging angle, between the first and second display regions of the display surface device.

18. The display apparatus according to claim 1,
wherein the display surface device is arranged in an indentation in an interior equipment element of the motor vehicle, the indentation having a longitudinal axis longer than a transverse axis perpendicular thereto, and
wherein the rail element is disposed displaceably parallel to the longitudinal axis of the indentation.

19. The display apparatus according to claim 18, wherein the indentation is aligned substantially parallel to a floor of the interior of the motor vehicle, whereby the rail element is displaceable only in a horizontal direction substantially parallel to the floor.

20. The display apparatus according to claim 1, wherein the interior equipment element of the motor vehicle is a center console aligned with a vehicle axis perpendicular to at least one axle of the motor vehicle, and
wherein the second display region of the display surface device is displaceable between a folded position behind the first display region from a viewpoint of a vehicle occupant and a viewing position substantially in line with, abutting and above the first display region.

* * * * *

UNITED STATES PATENT AND TRADEMARK OFFICE
CERTIFICATE OF CORRECTION

PATENT NO. : 10,917,984 B2
APPLICATION NO. : 16/467839
DATED : February 9, 2021
INVENTOR(S) : Immo Redeker et al.

It is certified that error appears in the above-identified patent and that said Letters Patent is hereby corrected as shown below:

In the Claims

Column 9, Line 21 (approx.):
In Claim 5, before "claim" insert -- to --.

Column 9, Line 37 (approx.):
In Claim 9, before "claim" insert -- to --.

Signed and Sealed this
Sixth Day of July, 2021

Drew Hirshfeld
*Performing the Functions and Duties of the*
*Under Secretary of Commerce for Intellectual Property and*
*Director of the United States Patent and Trademark Office*